(12) United States Patent
Hatsugai

(10) Patent No.: US 6,489,846 B2
(45) Date of Patent: Dec. 3, 2002

(54) DISTORTION COMPENSATING DEVICE AND DISTORTION COMPENSATING METHOD

(75) Inventor: Tadanaga Hatsugai, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/862,578

(22) Filed: May 22, 2001

(65) Prior Publication Data

US 2002/0027473 A1 Mar. 7, 2002

(30) Foreign Application Priority Data

May 25, 2000 (JP) .......................................... 2000-155030
Jul. 7, 2000 (JP) .......................................... 2000-206331

(51) Int. Cl.$^7$ ................................................ H03F 1/26
(52) U.S. Cl. .................. 330/149; 375/297; 330/107; 330/136
(58) Field of Search ............................... 330/107, 136, 330/149; 375/297

(56) References Cited

U.S. PATENT DOCUMENTS

| | | | | |
|---|---|---|---|---|
| 5,742,201 A | * | 4/1998 | Eisenberg et al. | 330/136 |
| 6,002,300 A | * | 12/1999 | Herbster et al. | 330/136 |
| 6,029,285 A | * | 2/2000 | Belcher et al. | 330/136 |
| 6,075,411 A | * | 6/2000 | Briffa et al. | 330/149 |
| 6,091,298 A | * | 7/2000 | McNicol et al. | 330/107 |
| 6,112,062 A | * | 8/2000 | Hans et al. | 330/149 |
| 6,275,685 B1 | * | 8/2001 | Wessel et al. | 330/149 |

* cited by examiner

*Primary Examiner*—Robert Pascal
*Assistant Examiner*—Khanh Van Nguyen
(74) *Attorney, Agent, or Firm*—Jay H. Maioli

(57) ABSTRACT

An amplitude compensator utilized in a distortion compensating device which compensates non-linearity in amplitude and phase of an input-output characteristic of a high frequency power amplifier incorporated in a mobile phone in which the input-output amplitude characteristic of the high frequency power amplifier is fitted by a hyperbolic tangent function, and an inverse hyperbolic tangent function is obtained by using two parameters, thereby providing amplitude compensation. A voltage input-output characteristic of the power amplifier is fitted to a hyperbolic function including predetermined parameters and a logarithmic function constituted by the parameters after the fitting and a linear gain of the power amplifier is obtained. An envelope voltage of an envelope signal obtained by detection of a modulated input signal is applied to the logarithmic function to obtain an amplitude compensating value. Based on this amplitude compensating value, an amplitude of the modulated signal is converted and a resulting modulated input signal is inputted to the power amplifier.

14 Claims, 11 Drawing Sheets

DISTORTION COMPENSATING DEVICE AND DISTORTION COMPENSATING METHOD

BACKGROUND OF THE INVENTION

1. Field of the Invention

The present invention relates to a distortion compensating device, and particularly to a distortion compensating device applicable to a high-frequency power amplifier.

2. Description of the Related Art

With an increasing speedup and capacity in telecommunication in recent years, there is a demand for a stringent linearity in a transmission high-frequency power amplifier in the field of digital radio communication equipment. At the same time, this trend also hinders improvement in power efficiency in the high-frequency power amplifier. On the other hand, digital mobile phones are already wide spread in the market, and there is an ever increasing demand for a longer operation time available for a continuous telephone call on these phones. When a new digital wireless communication device is introduced into the market, the length of usable time is becoming an un-negligible factor in view of product competition. Given such a background as the above, there is an increasing trend for improving the efficiency by means of distortion compensation technology represented by such a device as a predistorter. However, introduction of such a technology as the above will require an extremely large sized circuit, making difficult adaptation thereof to the mobile phone that is sold on advantages of light weight and compactness.

In general, the high-frequency power amplifier for use in the telecommunication has a problem of increased non-linearity in an input-output characteristic that results in distorted output signal if efficiency in power utility is to be improved. In an attempt to solve this problem, a predistorter has been used. Specifically, a compensating device having a reverse characteristic to the characteristic of the high-frequency power amplifier is connected to a prestage of the high-frequency power amplifier, in order to cancel the distortion.

Further, in general, the nonlinear characteristic of an amplifier changes over time, temperature and so on. For this reason, a compensating characteristic of the compensator must be changed in accordance with the characteristic change in the amplifier. This is called adaptive compensation.

An example of such a predistorter is "MEMORYLESS POLYNOMIAL ADAPTIVE PREDISTORSION" IEEE. Int. conf. Acoust speech process 1995. No5. pp981–985. FIG. 12 is a system diagram of a principal portion of a distortion compensation circuit shown in the above document. FIG. 13 is a detailed system diagram of a portion in FIG. 12 directly related to the compensation.

Referring now to FIG. 12, digital modulation yields a couple of base-band signals, i.e. an orthogonal component Q and an in-phase component I (hereinafter called I signal and Q signal). These signals are fed to input terminals $T_1$ and $T_2$, then receive pulse shaping performed by pulse filters $1a$ and $1b$, and then inputted to a distortion compensator 2.

The distortion compensator 2 shown in detail in FIG. 13 includes at least a voltage amplitude calculator $2a$ and a phase calculator $2b$, and outputs the I" signal and Q" signal for compensation of distortion in amplitude and phase of a signal generated by a high-frequency power amplifier (hereinafter called HPA) 5. The I" and Q" signals receive analog conversion in digital-analog converters (hereinafter called DAC) $3a$, $3b$ respectively, and then are fed to accumulators $4a$, $4b$ in a quadrature modulator 4, where a carrier cos ω t and sin ω t from an oscillator are multiplied. An output as a result of the accumulations is applied via an adder $4c$ to the amplitude characteristic and the phase characteristics, to compensate for nonlinear input-output characteristic of the HPA 5. Then an output from the HPA 5 is supplied to an output terminal T3 and a restoring calculator 6.

A base band signal demodulated by the quadrature demodulator 6 is inputted to the distortion compensator 2 via an analog-digital converter (hereinafter, referred to ADC)7.

The distortion compensator 2 shown in FIG. 12 is constituted as shown in FIG. 13. Description will now cover FIG. 13 briefly. The two base-band signals I, Q generated by the digital modulation are fed to a voltage amplitude calculator $2a$ for calculation of a voltage amplitude √ ($I^2+Q^2$). A phase difference calculator $2b$ calculates a phase difference φ+arctan (I/Q) between the I and Q signals. The voltage amplitude value is inputted to an amplitude compensator $2d$ for conversion into a signal that compensates for the amplitude distortion. An I-Q restoring calculator $2e$ calculates, from the phase difference φ sent from the phase difference calculator $2b$ and a compensating voltage amplitude v' sent from the amplitude compensator $2d$, a signal I'=v' cos φ and signal Q'=v' sin φ. A shift synthesizing calculator $2f$ calculates a compensating phase value θ that corresponds to the compensating voltage amplitude v'. By using this phase value θ and the signals I' and Q', calculation of I"=I' cos θ−Q'·sin θ and Q"=Q'·cos θ+I'·sin θ are made. Outputs from these calculations are fed to DAC's $3a$, $3b$ in FIG. 12.

According to the prior art distorter described above, a higher degree polynomial expression is used for the calculation of the compensating amplitude voltage v' for the compensation of the amplitude compensator $2d$ and for determining θ necessary for the phase compensation.

This means an increase in the number of variables that must be used for obtaining the compensating value for the compensator 2. The increase in the number of the variables leads to an increase in the size of circuit, eventually leading to an increase in power consumption in actual utilization of the distortion compensator 2. Further, if the amplitude compensating function is a multinomial, then a solution cannot be obtained as a mathematically exact solution. In other words, the obtained value is nothing more than an accidental discovery of the compensating function. With such a method as this, there is definitely a limitation to the effect of the compensation.

In "ADAPTIVE DIGITAL PREDISTORTER FOR POWER AMPLIFIERS WITH REAL TIME MODELING OF MEMORYLESS COMPLEX GAINS" by Ernesto G. Jeckeln el. al, IEEE. MTT-S digest 1996, pp835–838 it is disclosed that a broken-line approximation is used in the calculation of v' for performing the amplitude distortion compensation, and calculation of θ necessary for the phase distortion compensation.

In such a case as this, in which broken-line approximation is used as the method for the compensation calculation and a broken-line approximation equation is used as a compensating function, the compensation does not truthfully reflect the actual characteristics of the amplifier, and so there is a limitation to the effect of the compensation.

The prior art distortion compensation is an adaptive compensation based on the base-band signal (in other words, the compensation in a predetermined digital computing portion) For this reason, a quadrature demodulator is essential. Further, the need for the quadrature demodulator means a significant increase in the size of circuit, leading to a problem of increased power consumption in the entire compensator.

Further, although the significance of the distortion compensation is to improve on the overall efficiency of the power amplifier by reducing the distortion, such an increase in power consumption as described above rather creates a problem of decreased efficiency. Further, the increase in the size of circuit goes against the fundamental advantage of the light weight and compactness of the mobile phone in terms of the constitution.

SUMMARY OF THE INVENTION

An object of the present invention is to provide a distortion compensation device in which coefficients necessary for computing a compensation power amplitude v' in the amplitude compensator needs only two constants and the size of a circuit can be economized.

A distortion compensating device according to the present invention provides compensation as shown in FIG. 1 and FIG. 2, in an input-output characteristic of an amplitude and a phase of the HPA 5, characterized in that the distortion compensating device is provided with amplitude compensators 2d, 2d1, and 2d2 for conversion of an in-phase signal I and an orthogonal signal Q into an in-phase signal I'=f(vi) and an orthogonal signal Q'=f(vq) for the compensation in an voltage amplitude, where vi representing a voltage of the parallel signal, vq representing a voltage of the orthogonal signal, the conversion being made by applying vi and vq to a function constituted by using two coefficients a and b and given as $f(v)=-\frac{1}{2} \cdot b \cdot \log((a-g \cdot v)/(a+g \cdot v))$ obtained by using two coefficients a and b, the coefficients a and b being obtained as two parameters that fit the input-output characteristic of the HPA 5 to a hyperbolic tangent function vout=a·tan h (bvin), where vin and vout representing an input voltage and output voltage respectively of the HPA 5, and g representing a linear gain.

A second distortion compensating device according to the present invention comprises as shown in FIG. 1: amplitude compensators 2c1, 2c2 for conversion of an in-phase signal I and an orthogonal signal Q into an in-phase signal I'=f(vi) and an orthogonal signal Q'=f(vq) for the compensation in an voltage amplitude, where vi representing a voltage of the in-phase signal, vq representing a voltage of the orthogonal signal, the conversion being made by applying vi and vq to a function constituted by using two coefficients a and b and given as $f(v)=-\frac{1}{2} \cdot b \cdot \log((a-gv)/(a+gv))$ given by using two coefficients a and b, the coefficients a and b being obtained as two parameters that fit the input-output characteristic of the HPA 5 to vout=a·tan h (bvin), where vin and vout representing an input voltage and output voltage respectively of the amplifying means, and g representing a linear gain; voltage amplitude calculator 2a for computing a voltage amplitude v=(I'2+Q'2) of the two signals I and Q; a phase reference table 2g storing a table of data corresponding one on one to each value of the voltage amplitude for extraction, from the table, of a specific phase value corresponding to a given voltage amplitude v; and phase synthesizing means for computing I"=I' cos−Q' sin and Q"=Q' cos+I' sin, by using the phase value and the two signals I' and Q', characterized in that the two signals I" and Q" are used as distortion compensating data.

A third distortion compensating device provided by the present invention comprises as shown in FIG. 2: a voltage amplitude calculator 2a for computing a voltage amplitude $v=\sqrt{(I^2+Q^2)}$ of two signals provided by an in-phase signal I and an orthogonal signal Q; a phase difference calculator 2b for calculating a phase difference φ between the two signals I and Q; an amplitude compensator 2d for applying the voltage amplitude v provided by an output from the voltage amplitude calculator 2a to a function f thereby converting into a compensating voltage amplitude f(v); an I-Q restoring calculator 2e for calculation of a signal I'=f(v)·cos θ and Q'=f(v)·sin θ, from the phase difference φ and the compensating voltage amplitude f(v); a phase reference table 2g storing a table of data corresponding one on one to each value of the voltage amplitude for extraction, from the table, of a phase value θ corresponding to a given compensating voltage amplitude f(v); and a phase synthesizing calculator 2f for computing I"=I' cos θ−Q'·sin θ and Q"=Q'·cos θ+I'·sin θ, by using the phase value θ and the two signals I' and Q', characterized in that the two signals I" and Q" are used as distortion compensating data.

According to each of the first through third distortion compensating devices provided by the present invention, constants for the calculation of compensating voltage amplitude in the amplitude compensator incorporated in the distortion compensating device can be two coefficients a and b. Thus, it becomes possible to provide a distortion compensating device capable of reducing the size of a circuit. In addition, by using a tan h function, it becomes possible to provide a distortion compensating device capable of providing a compensation having a mathematically exact inverse characteristic.

A forth distortion compensation device according to the present invention is to provide a distortion compensation device and method which in a transmission system of e.g. wireless communication equipment restrains an increase in the size of a circuit and the consumption of an electric current as well as realizes high precision amplitude distortion compensation while performing compensation and adaptive compensation of amplitude distortion and the phase of a signal to be modulated.

Another of the present invention provides a distortion compensating device placed before a power amplifier, comprising: means for detecting a modulated signal thereby obtaining an envelope voltage $V_{env}$ of a detected envelope signal; means for fitting a voltage input-output characteristics of the power amplifier to a hyperbolic function including parameters a and b, given as $v_{out}=a \cdot \tan h\ (b \cdot v_i)$, (where $v_i$ represents an input voltage, $V_{out}$ representing an output voltage); means for calculating an amplitude compensating value $f(V_{env})$ by substituting the envelope voltage $V_{env}$ for x in a function including the parameters a and b, given as:

$$f(x) = -\frac{1}{2 \cdot b} \cdot \log \frac{a-g \cdot x}{a+g \cdot x} \qquad \text{[Expression 7]}$$

(where g represents a linear gain of the power amplifier); means for converting an amplitude of the modulated signal, based on the amplitude compensating value; and means for inputting the modulated signal as after the conversion, to the power amplifier.

Further, another of the present invention provides a distortion compensating device placed before a power amplifier, comprising: means for detecting a modulated signal thereby obtaining a first envelope voltage of a detected envelope signal; means for fitting a voltage input-output characteristics of the power amplifier to a first function that uses predetermined parameters; means for calculating an amplitude compensating value by applying the first envelope voltage to a second function constituted by the parameters as after the fitting and a linear gain of the power amplifier; means for converting an amplitude of the modulated signal, based on the amplitude compensating value; means for detecting an output from the power amplifier corresponding to an input of the modulated signal as after the conversion thereby obtaining a second envelope voltage of a detected envelope signal; and means for applying the first envelope voltage and the second envelope voltage to a third function including the parameter used for the calculation of the amplitude compensating value, thereby updating these parameters; the parameters as after the updating are applied to the fitting.

Another of the present invention provides a distortion compensating device placed before a power amplifier, comprising: means for detecting a modulated signal thereby obtaining a first envelope voltage $V_{env}$ of a detected envelope signal; means for fitting a voltage input-output characteristics of the power amplifier to a hyperbolic function including parameters a and b given as $v_{out}$=a·tan h (b·$v_i$), (where $v_i$ represents an input voltage, $v_{out}$ representing an output voltage); means for calculating an amplitude compensating value f($V_{env}$) by substituting the first envelope voltage $V_{env}$ for x in a function including the parameters a and b, given as:

$$f(x) = -\frac{1}{2 \cdot b} \cdot \log\frac{a - g \cdot x}{a + g \cdot x} \qquad \text{[Expression 8]}$$

(where g represents a linear gain of the power amplifier); means for converting an amplitude of the modulated signal, based on the amplitude compensating value; means for detecting an output from the power amplifier corresponding to an input of the modulated signal as after the conversion thereby obtaining a second envelope voltage $V'_{outenv}$ of a detected envelope signal; and means for calculating updated parameters $a_{new}$ and $b_{new}$ of the parameters a and b, from a third function constituted by the parameters a and b used for the calculation of the amplitude compensating value and the envelope voltages $V_{env}$ and $V'_{outenv}$, given as:

$$a_{new} = a - \alpha \cdot [2 \cdot V'_{outenv} \cdot \tanh(b \cdot V_{env}) - \qquad \text{[Expression 9]}$$
$$2 \cdot a \cdot \tanh^2(b \cdot V_{env})]$$
$$b_{new} = b - \alpha \cdot [2 \cdot a \cdot V_{env} \cdot \text{sech}(b) \cdot -$$
$$(a \cdot \tanh \cdot (b \cdot V_{env}) - V'_{outenv}]$$

(where α represents a constant); characterized in that the updated parameters $a_{new}$ and $b_{new}$ are applied to the fitting.

Further, another of the present invention provides a distortion compensating method for performing a distortion compensation before a power amplifier, comprising: a step of detecting a modulated signal, thereby obtaining an envelope voltage of a detected envelope signal; a step of fitting a voltage input-output characteristics of the power amplifier to a first function including a predetermined parameter; a step of calculating an amplitude compensating value by applying the envelope voltage to a second function constituted by the parameter as after the fitting and a linear gain of the power amplifier; a step of converting an amplitude of the modulated signal, based on the amplitude compensating value; and a step of inputting the modulated signal as after the conversion, to the power amplifier.

Another of the present invention provides a distortion compensating method for performing a distortion compensation before a power amplifier, comprising: a step of detecting a modulated signal thereby obtaining an envelope voltage $V_{env}$ of a detected envelope signal; a step of fitting a voltage input-output characteristics of the power amplifier to a hyperbolic function including parameters a and b, given as $v_{out}$=a·tan h (b·$v_i$), (where $v_i$ represents an input voltage, $v_{out}$ representing an output voltage); a step of calculating an amplitude compensating value f($V_{env}$) by substituting the envelope voltage $V_{env}$ for x in a function including the parameters a and b, given as:

$$f(x) = -\frac{1}{2 \cdot b} \cdot \log\frac{a - g \cdot x}{a + g \cdot x} \qquad \text{[Expression 10]}$$

(where g represents a linear gain of the power amplifier); a step of converting an amplitude of the modulated signal, based on the amplitude compensating value; and a step of for inputting the modulated signal as after the conversion, to the power amplifier.

Further, another of the present invention provides a distortion compensating method for performing a distortion compensation before a power amplifier, comprising: a step of detecting a modulated signal thereby obtaining a first envelope voltage of a detected envelope signal; a step of fitting a voltage input-output characteristics of the power amplifier to a first function that uses predetermined parameters; a step of calculating an amplitude compensating value by applying the first envelope voltage to a second function constituted by the parameters as after the fitting and a linear gain of the power amplifier; a step of converting an amplitude of the modulated signal, based on the amplitude compensating value; a step of detecting an output from the power amplifier corresponding to an input of the modulated signal as after the conversion thereby obtaining a second envelope voltage of a detected envelope signal; and a step of applying the first envelope voltage and the second envelope voltage to a third function including the parameter used for the calculation of the amplitude compensating value, thereby updating these parameters; and a step of applying the parameters as after the updating to the fitting.

Further, another of the present invention provides a distortion compensating method for performing a distortion compensation before a power amplifier, comprising: a step of detecting a modulated signal thereby obtaining a first envelope voltage $V_{env}$ of a detected envelope signal; a step of fitting a voltage input-output characteristics of the power amplifier to a hyperbolic function including parameters a and b given as $v_{out}$=a·tan h (b·$v_i$), (where $v_i$ represents an input voltage, $v_{out}$ representing an output voltage); a step of calculating an amplitude compensating value f($V_{env}$) by substituting the first envelope voltage $V_{env}$ for x in a function including the parameters a and b, given as:

$$f(x) = -\frac{1}{2 \cdot b} \cdot \log\frac{a - g \cdot x}{a + g \cdot x} \qquad \text{[Expression 11]}$$

(where g represents a linear gain of the power amplifier); a step of converting an amplitude of the modulated signal, based on the amplitude compensating value; a step of detecting an output from the power amplifier corresponding to an input of the modulated signal as after the conversion thereby obtaining a second envelope voltage $V'_{outenv}$ of a detected envelope signal; and a step of calculating updated parameters $a_{new}$ and $b_{new}$ of the parameters a and b, from a third function constituted by the parameters a and b used for the calculation of the amplitude compensating value and the envelope voltages $V_{env}$ and $V'_{outenv}$, given as:

$$a_{new} = a - \alpha \cdot [2 \cdot V'_{outenv} \cdot \tanh(b \cdot V_{env}) - 2 \cdot a \cdot \tanh^2(b \cdot V_{env})]$$

$$b_{new} = b - \alpha \cdot [2 \cdot a \cdot V_{env} \cdot \text{sech}(b) \cdot - (a \cdot \tanh \cdot (b \cdot V_{env}) - V'_{outenv}]$$

[Expression 12]

(where α represents a constant); and a step of applying the updated parameters $a_{new}$ and $b_{new}$ to the fitting.

DESCRIPTION OF THE PREFERRED EMBODIMENTS

[Embodiment 1]

Figure 1:
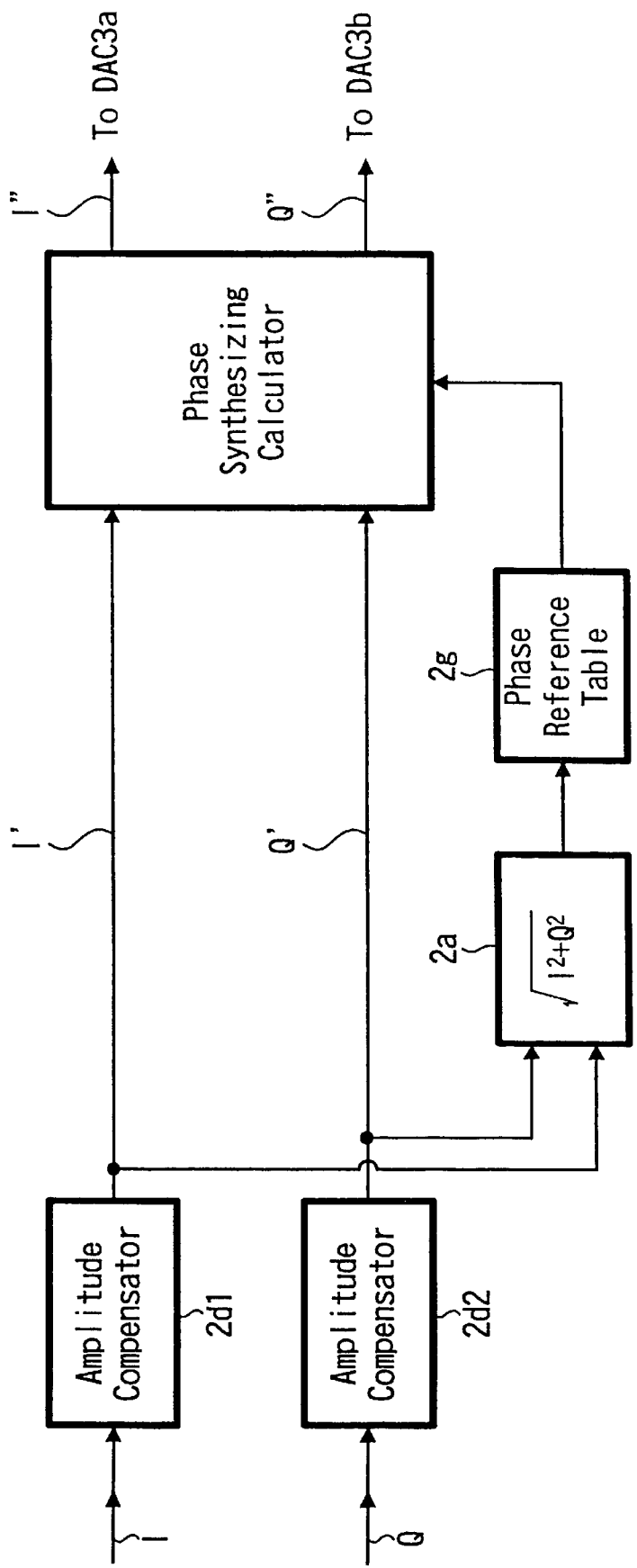
FIG. 1 is a system diagram of an embodiment of the distortion compensating device according to the present invention.

Hereinafter, an embodiment of the distortion compensating device according to the present invention will be described with reference to FIG. 1 through FIG. 5. FIG. 1 is a system diagram of the distortion compensating device as the embodiment of the present invention. It should be noted here that components in the present invention corresponding to those in the prior art distortion compensating device described in FIG. 12 and FIG. 13 will be indicated and described by using the same alpha-numeral codes.

Figure 12:
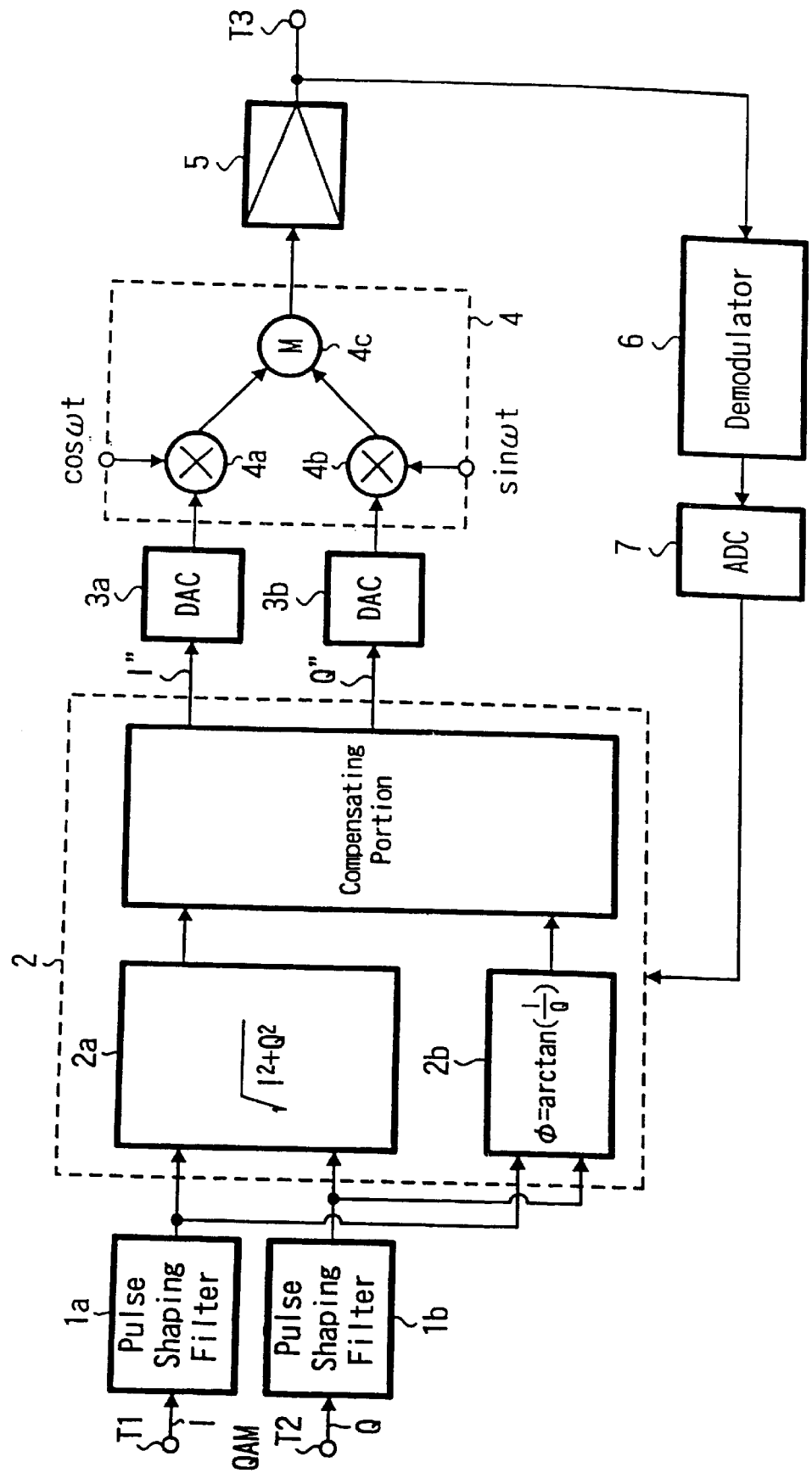
FIG. 12 is a system diagram of a prior art distortion compensating device.

The system diagram shown in FIG. 1 corresponds to the system diagram of the distortion compensator 2 shown in FIG. 12. The two base-band signals, i.e. an in-phase signal I and an orthogonal signal Q, are applied to a compensating function f by amplitude compensators 2d1 and 2d2, and converted into I'=f(I) and Q'=f(Q) respectively. Details of this compensating function f will be described later.

The signals I', Q' from the amplitude compensators 2d1 and 2d2 are supplied to a voltage amplitude calculator 2a and a shift synthesizing calculator 2f.

Based on the signals I', Q' from the amplitude compensators 2d1, 2d2, a voltage amplitude calculator 2a calculates a voltage amplitude $v_{pd}=\sqrt{(I'^2+Q'^2)}$, and supplies a result to a phase reference table 2g. The phase reference table 2g is a table provided by memory means such as a ROM, which stores data uniquely corresponding to each value of the voltage amplitude $V_{pd}$. Therefore, from this phase reference table 2g, there is extracted a specific value for a phase value θ corresponding one on one to the given voltage amplitude $V_{pd}=\sqrt{(I'^2+Q'^2)}$, and the extracted value is supplied to the shift synthesizing calculator 2f.

By using this phase value θ from the phase reference table 2g and the signals I' and Q' from the amplitude compensators 2d1 and 2d2, the shift synthesizing calculator 2f calculates I"=I' cos θ−Q' sin θ and Q"=Q' cos θ+I' sin θ. The outputs I", Q" from the calculation provides the amplitude distortion compensation data.

Now, description will be made of the function f used in the amplitude compensators 2d1 and 2d2 described above. First, identification is made in advance to parameters a, b that will give an output voltage atanh(bvin), where vi represents a voltage amplitude input to the high-frequency power amplifier (HPA) 5. With the above, the function if is a function that will give an output $f(v)=-\frac{1}{2} \cdot b \cdot \log((a-g \cdot v)/(a+g \cdot v))$, where v represents a voltage amplitude input to the UPA 5 and g represents a linear gain of the HPA 5 as after the distortion compensation. Under the conditions above, f(v) will give a relationship given by the expression atan h (bf(v))=gv, making possible to maintain a capability to cancel a non-linearity of the HPA 5.

Figure 2:
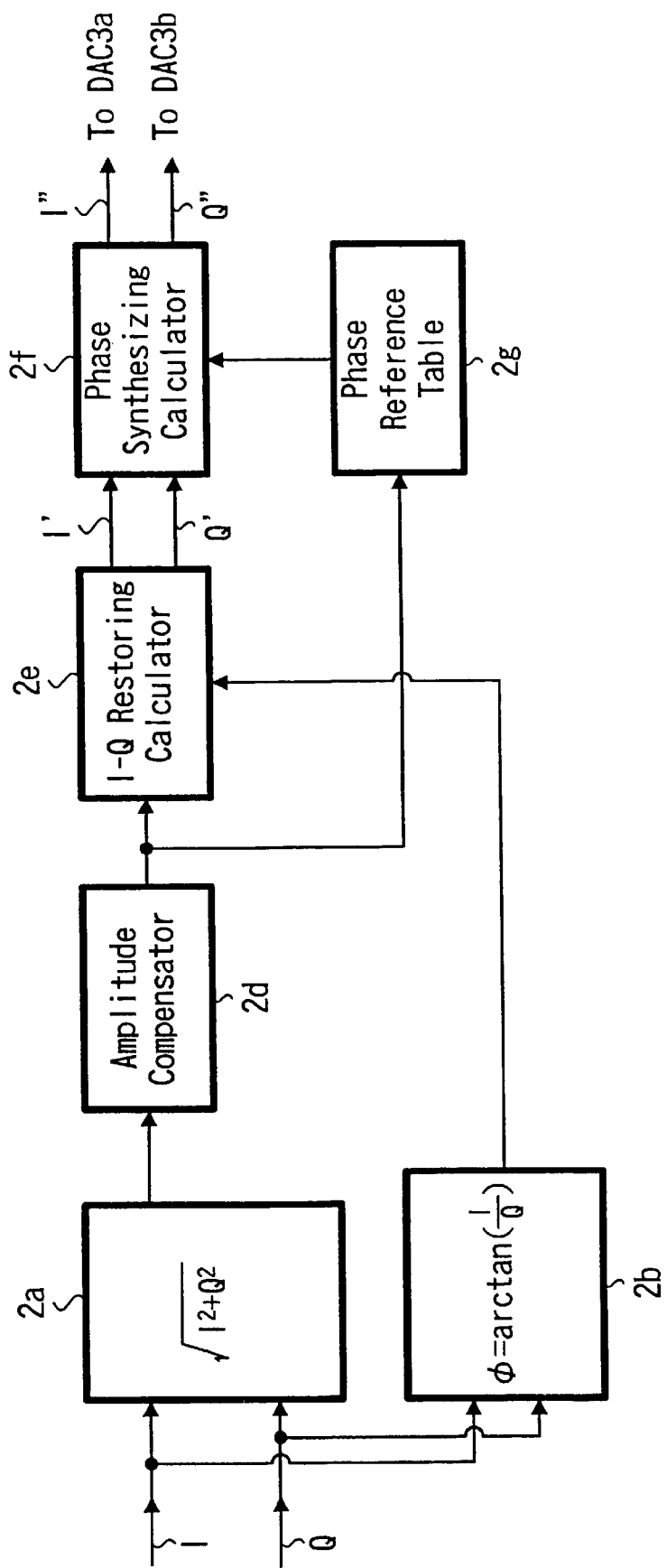
FIG. 2 is a system diagram of another embodiment of the distortion compensating device according to the present invention.
Figure 13:
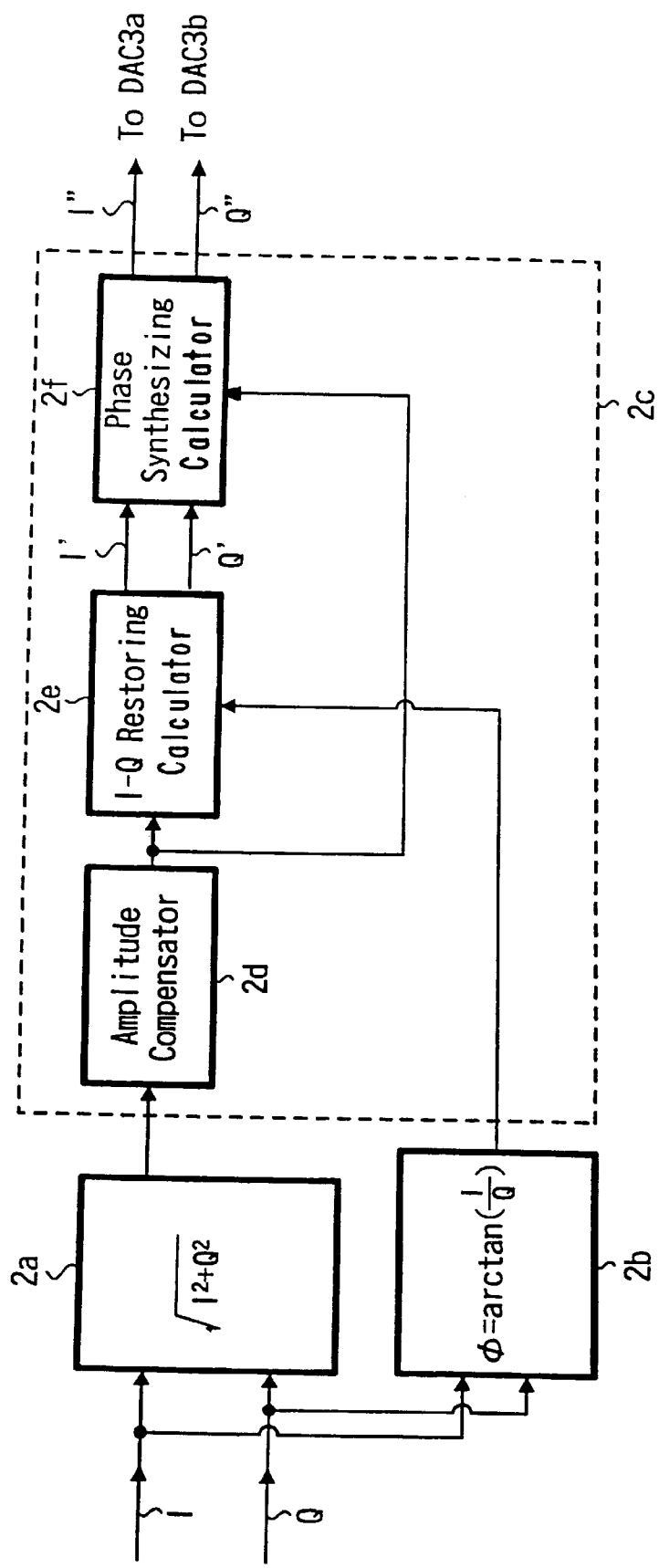
FIG. 13 is a system diagram of a distortion compensator of the prior art distortion compensating device.

FIG. 2 shows another constitution example of the distortion compensator 2 according to the present invention, having generally the same constitution as shown in FIG. 13, differing, however, in the method of calculation performed in the amplitude compensator 2d. Again in this case, as in the case shown in FIG. 1, it is possible to perform a real-time distortion compensation to the nonlinear portion of the amplitude-amplitude characteristic of the HPA 5, with the phase characteristic being compensated by using the phase reference table 2g.

In FIG. 2, two signals I, Q generated by a digital modulation are inputted to a voltage amplitude calculator 2a, and a voltage amplitude $v=\sqrt{(I^2+Q^2)}$ of the two signals I, Q is calculated. The calculated voltage amplitude v is supplied to an amplitude compensator 2d.

The two signals I, Q are also supplied to a phase difference calculator 2b, where a phase difference φ=arctan (I/Q) is calculated.

The amplitude compensator 2d applies the voltage amplitude v of the signals I, Q to a compensating function f. This compensating function f is the same as already described in the case shown in FIG. 1, i.e. the function that gives an output of the HPA 5 which is $f(v)=-\frac{1}{2} \cdot b \cdot \log((a-g \cdot v)/(a+g \cdot v))$, and which gives the relationship given by the expression atan h (bf (v))=gv.

The compensating voltage amplitude f(v) and the phase difference φ from the amplitude compensator 2d and a phase difference calculator 2b are supplied to an I-Q restoring calculator 2e, where a signal I'=f(v)·cos φ and signal Q'=f(v)·sin φ are calculated and supplied to a shift synthesizing calculator 2f.

The voltage amplitude from the amplitude compensator 2d is supplied to a phase reference table 2g, in which a phase value θ corresponding one one one to the given compensating voltage amplitude f(v) is extracted from a list of values stored in a ROM in correspondence to each value to be taken by the voltage amplitude v and supplied to the shift synthesizing calculator 2f. By using the phase value θ and the signals I', Q', the shift synthesizing calculator 2f calculates I"=I'·cos θ−Q·sin θ, and Q"=Q'·cos θ+I'·sin θ. The outputs I", Q" from the calculation are provided to the HPA 5 as real-time distortion compensating data.

Now, an operation performed in the above constitution will be described with reference to FIG. 3 through FIG. 5B.

Figure 3:
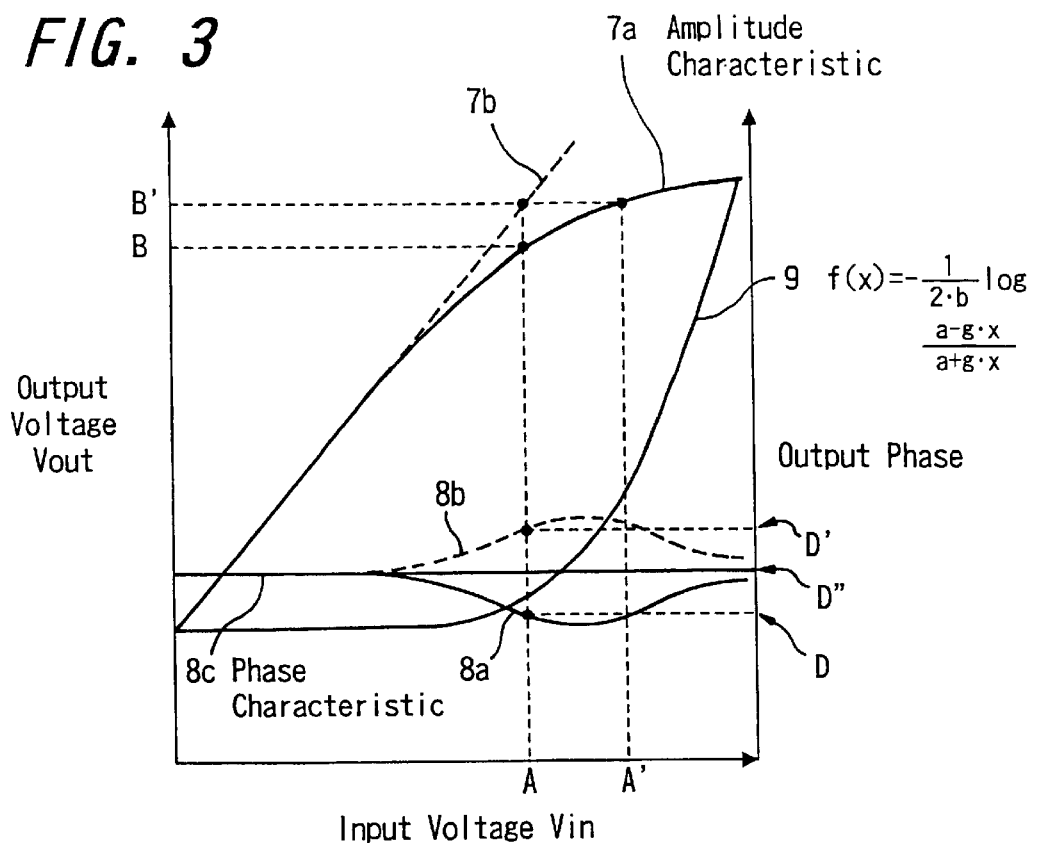
FIG. 3 is a graph showing curves of an input-output amplitude characteristic and a phase characteristic of a high frequency power amplifier.

FIG. 3 is an input-output characteristic curve showing a amplitude-amplitude characteristic and amplitude-phase characteristic of a typical HPA 5. The horizontal axis of the graph represents input voltage to the HPA 5 whereas the vertical axis represents output voltage and output phase from the HPA 5. Codes 7a and 7b indicate amplitude characteristics, whereas codes 8a, 8b and 8c indicate phase characteristics.

According to the amplitude characteristic 7a, there is a nonlinear portion in a range of high input voltage to the HPA 5. In this particular amplitude characteristic 7a, if the input voltage is A, then the output voltage is given by B. If the amplitude characteristic of the HPA 5 has linearity however, then the amplitude characteristic will be represented by a line 7b drawn in a broken line and the output voltage will be represented by B'. Thus, if an input voltage A' is used in place of the input voltage A, then the output voltage will be B', resulting in no amplitude distortion in the output voltage from the HPA 5.

Therefore, according to the present invention, a function for the conversion from A to A' is provided by a function f(x) given as a curve 9 in FIG. 3.

Further, the ROM which provides the phase reference table 2g serving as a phase compensator stores a list of values for the phase value θ corresponding one on one to each value to be taken by the voltage amplitude value v. The phase characteristic curve 8a given by a solid line in FIG. 3 represents an actual phase characteristic of the HPA 5 and if the input voltage is A, the output phase is D. If the phase characteristic of the HPA 5 is linear however, then the output phase will be given by a flat straight line 8c, with the output phase represented by D'. Thus, if the output phase D of the input voltage A is displaced in advance to match D', the two output phases after the HPA 5 cancel each other thereby providing an output phase D" in FIG. 3, eliminating the distortion in the output phase of the HPA 5.

Therefore, by storing phase compensating data representing the phase characteristic curve 8b represented by the broken line, over the entire input voltage range of the HPA 5, in the ROM of the phase reference table 2g, and by making an output corresponding one on one to a given voltage amplitude value, it becomes possible to perform the phase compensation.

Now, detailed description will be made of the function f used in the calculation performed in the amplitude compensators 2d, 2d1 and 2d2 described above. First, the voltage input-output characteristic of the HPA 5 is fitted in advance to a hyperbolic tangent function v=a·tan h (b·$v_{in}$) by using parameters a, b, where $v_{in}$ and $v_{out}$ represent an input voltage and an output voltage of the HPA 5 respectively, and g represents a linear gain of the HPA 5.

Figure 4:
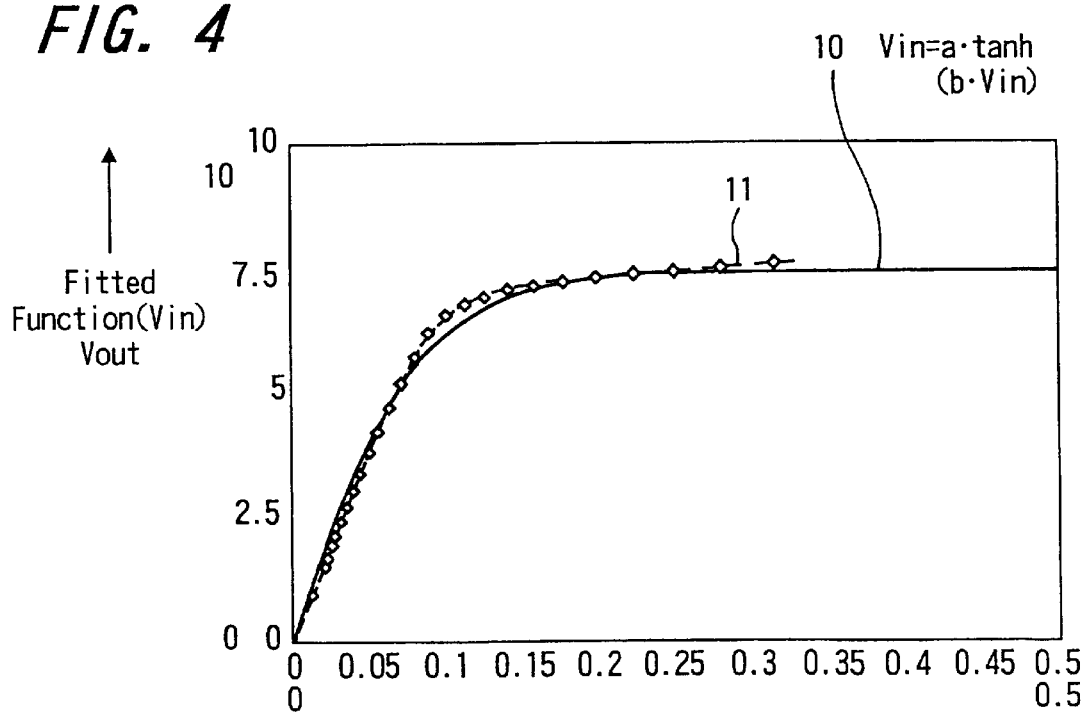
FIG. 4 is a graph comparing an input-output characteristic of the high frequency power amplifier and a curve fitted by means of a hyperbolic tangent function.

FIG. 4 shows an actual characteristic curve after the fitting in the HPA 5 of the voltage input-output characteristic. In FIG. 4, the horizontal axis represents input-output voltage of the HPA 5 whereas the vertical axis represents output voltage to $v_{in}$, of the fitting function and of the HPA 5. A curve 11 given by sequentially connecting a series of diamond points represents the actual output characteristic curve of the HPA 5 whereas a curve 10 shown by a solid line represents the characteristic curve given by the hyperbolic tangent function by which the fitting is made.

In order to achieve the distortion compensation as described above, it is necessary to obtain a function f which will give the relationship atanh (bf(v))=gv, where g represents the linear gain of the HPA 5. Mathematically, this means to obtain an inverse function of y=atanh (bx) which is symmetric with respect to y=gx. This inverse function can be obtained analytically, as the function f(v)=−½·b·log((a−g·v)/(a+g·v)) which is shown as a curve 9 in FIG. 1. Thus, the distortion in the high input side of the amplitude characteristic 7a is cancelled and the compensated amplitude characteristic 7b is obtained.

Figure 5A:
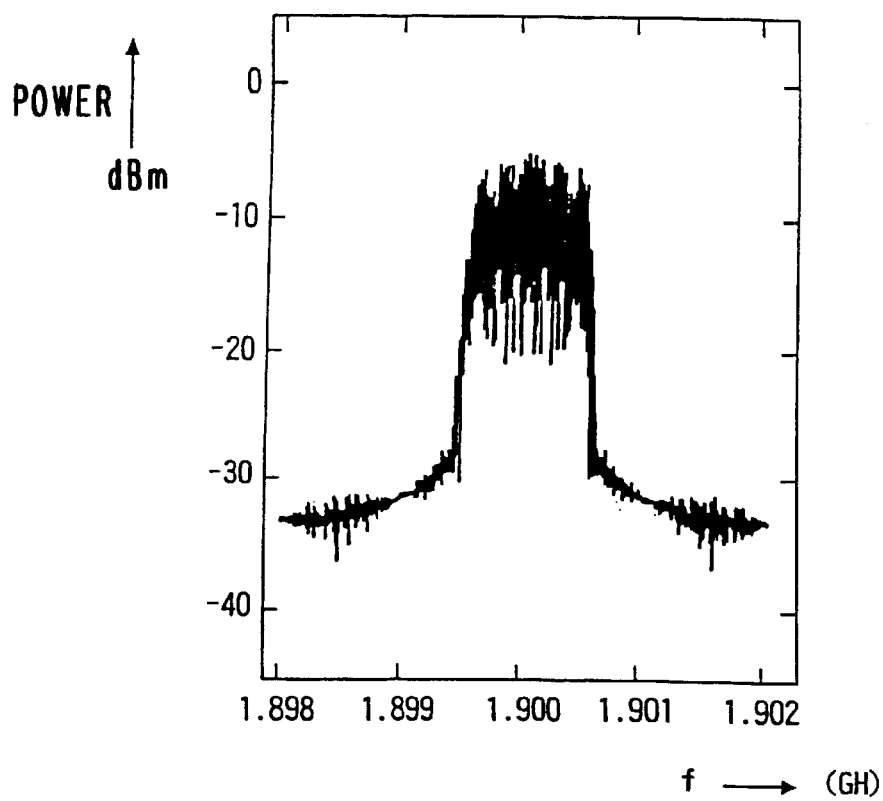
FIGS. 5A and 5B are graphs showing spectra of output signals obtained from a high frequency power amplifier by inputting an OQPSK signal which is not distortion-compensated and by inputting the OQPSK signal to which the present invention is applied.
Figure 5B:
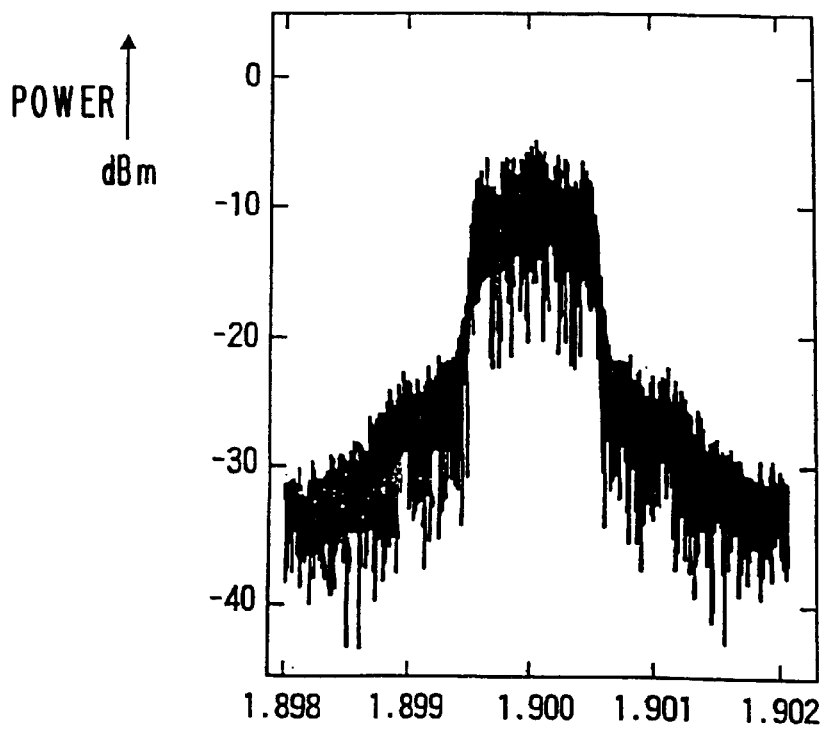

FIG. 5 (B) shows a distorted output spectrum obtained by inputting an OQPSK (Offset Quadrature Phase Shift Keying) signal to a HPA 5 having an amplitude phase distortion. Adjacent channel leak power ratio (ACPR), which is a drop-down power into a certain range centering on a frequency f away from a carrier frequency by Δ f (0.9 MHz), is −32 dBc. FIG. 5 (A) shows an output spectrum from the HPA 5 by inputting the OQPSK signal after the distortion compensation according to the present invention. The ACPR is −50dBc, and there is a remarkable improvement as much as 18 dB in terms of the ACPR.

According to the distortion compensating device described above, it becomes possible to dramatically reduce the number of coefficients of functions, specifically to reduce to only two, that must be stored for providing an amplitude compensator for compensating amplitude distortion through pre-distortion performed in a transmitting portion of a radio telecommunication system. Therefore, the size of the circuit can also be reduced. Further, since a mathematically precise inverse characteristic function is used as the amplitude compensator, a highly accurate amplitude compensation can become possible, providing a significant benefit.

It should be noted here that according to the above described embodiment, the voltage amplitude computing means 2a, the phase difference computing means 2b, and the amplitude compensating means 2d, 2d1, 2d2, the I-Q restoring computing means 2e, and the phase synthesis computing means 2f are described as a wired-logic hardware. Obviously however, these can be calculated by using a CPU or a digital signal processor (DSP) or other software.

According to the distortion compensator used in the distortion compensating device provided by the present invention, the number of variations used for calculation of compensating voltage amplitude is only two. This makes possible to reduce the size of circuit necessary in the distortion compensating device. In addition, since a mathematically precise inverse characteristic function is used in the amplitude compensator, highly accurate amplitude distortion compensation can be obtained.

Hereinafter, modes for carrying out the present invention will be described in detail, with reference to the attached drawings.

[Embodiment 2]

Figure 6:
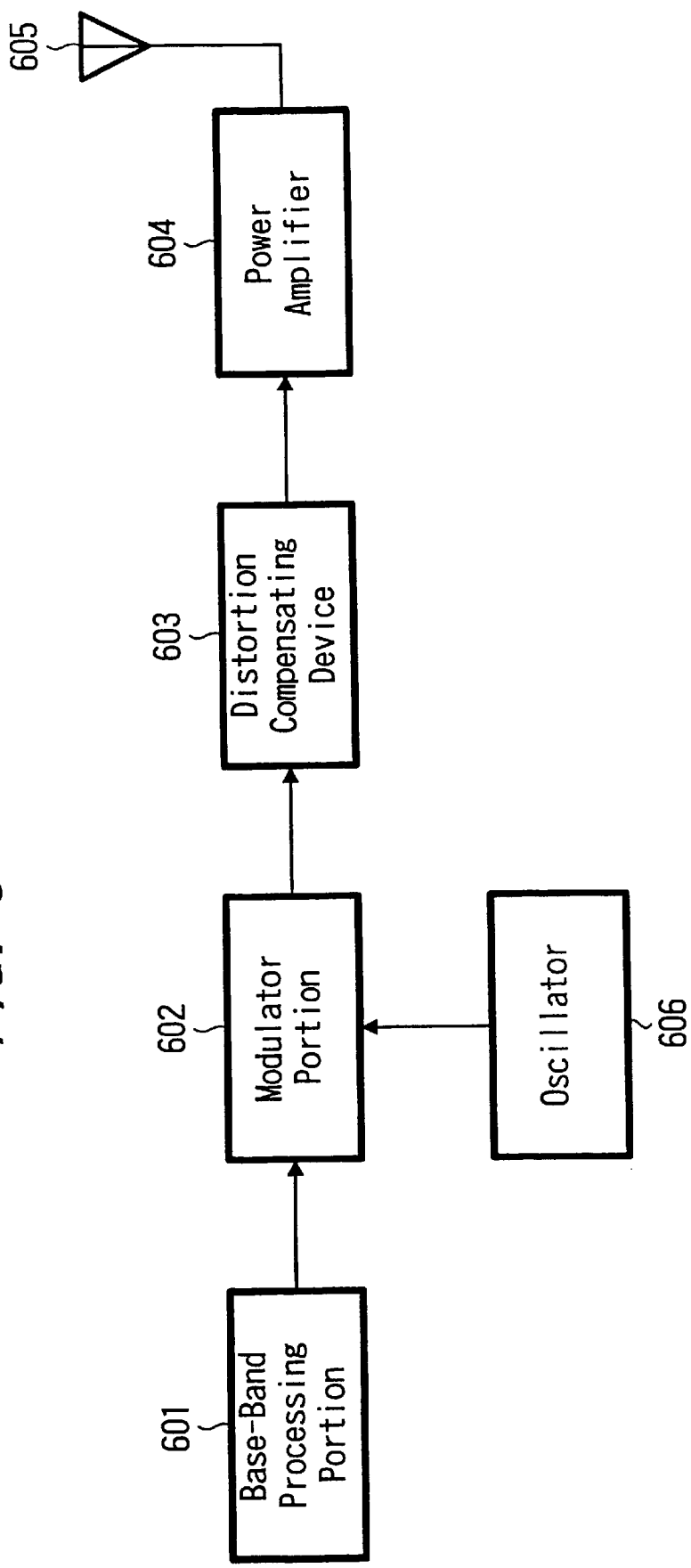
FIG. 6 is a block diagram outlining a constitution of a mobile telephone terminal incorporating a distortion compensating device according to Embodiment 1 of the present invention.

FIG. 6 is a block diagram outlining a constitution of a mobile telecommunication terminal incorporating a distortion compensating device according to Embodiment 2 of the present invention. As shown in the diagram, voice, sound and so on inputted to the mobile telecommunication terminal is sent to a base-band processing portion 601. A modulating portion 602 is provided by a quadrature modulator performing a predetermined modulating process, in which a base-band signal from the base-band processing portion 601 is multiplied with a carrier signal of a predetermined frequency from an oscillator 606. Then, a high frequency signal outputted from the modulating portion 602 is inputted to a distortion compensation device 603 and receives a distortion compensation as will be described later, and then is amplified by a power amplifier 604. The amplified signal is then transmitted from an antenna 605.

Figure 7:
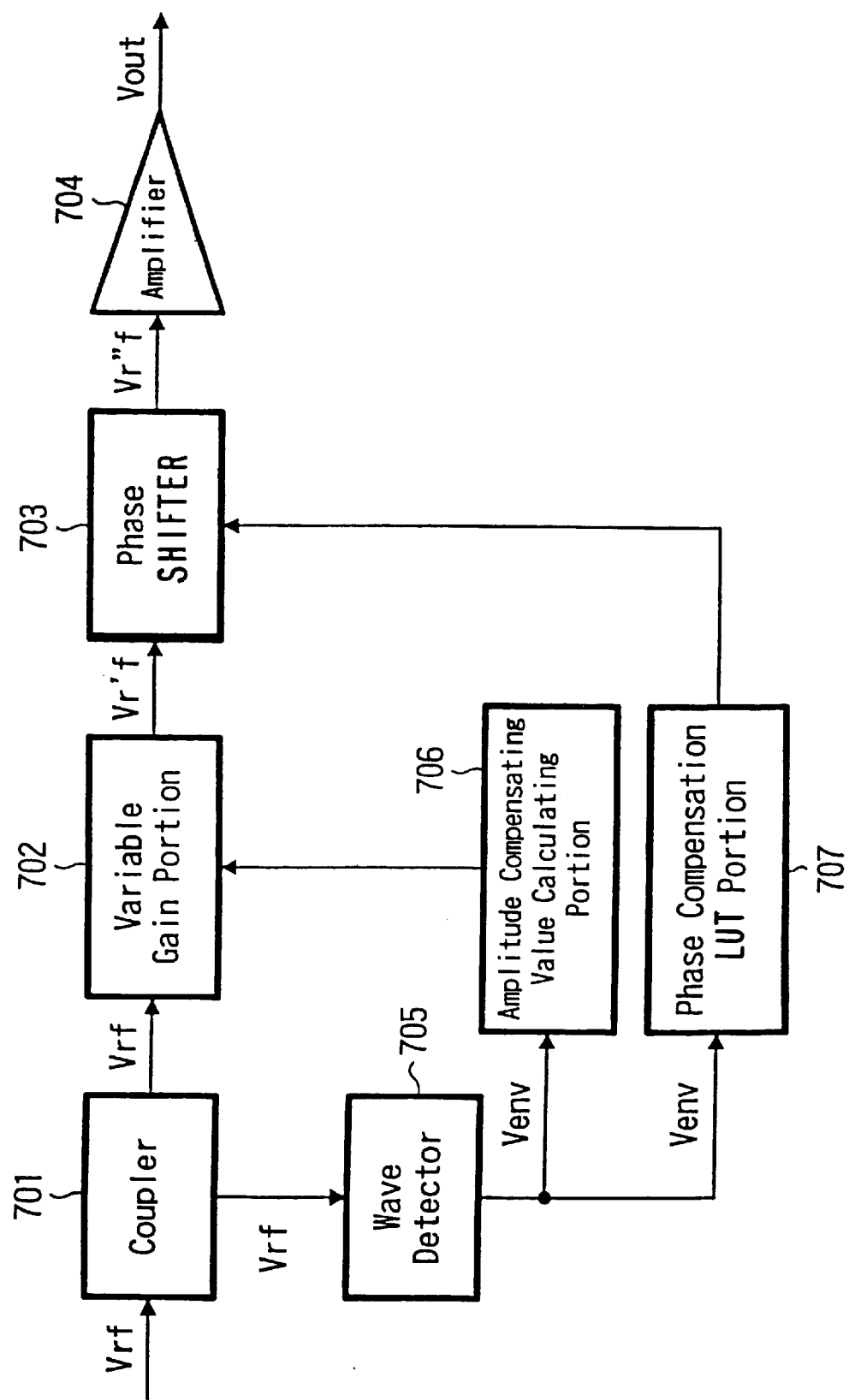
FIG. 7 is a block diagram showing a constitution of the distortion compensating device according to Embodiment 1 of the present invention.

FIG. 7 is a block diagram showing a constitution of the distortion compensating device incorporated in the mobile telecommunication terminal in FIG. 6. According to the distortion compensating device shown in this diagram, the high frequency signal $V_{rf}$ (instantaneous value) outputted from the quadrature modulator is inputted to a variable gain portion 702 and to a wave detector 705 by a coupler 701 (capable of distributing a same signal to a plurality of paths). The wave detector 705 outputs an envelope power level of the inputted high frequency signal $V_{rf}$ as a voltage $V_{env}$ (envelope signal). The voltage $V_{env}$ is inputted to an amplitude compensation value calculating portion 706 and to a phase compensation look-up table (LUT) portion 707.

The amplitude compensation value calculating portion 706 calculates a level of compensation by applying the envelope signal $V_{env}$ to a compensating function f to be described later, and then inputs a result of the calculation to the variable gain portion 702, as conversion information. The variable gain portion 702 is a kind of amplifier, where the input signal $V_{rf}$ is converted to an amplitude compensating signal $V'_{rf}$ based onthe inputted conversion information. The signal $V'_{rf}$ is then sent of a phase shifter 703.

The phase compensation LUT portion 707 is specifically a table provided by a read-only memory (ROM), and stores data uniquely corresponding to each of the values to be taken by the envelope signal $V_{env}$. From this table, a phase value θ corresponding a given value of the envelope signal $V_{env}$ is extracted from a memory address in the ROM.

The data stored in the phase compensation LUT portion 707 is based on an actual phase obtained from actual measurement on the outputs from an amplifier of a known characteristic. Further, the phase value extracted from the phase compensation LUT portion 707 is a digital signal, and the phase value must be converted to an analog signal for the following part of the process. For this purpose, an unillustrated digital/analog converter is provided on the output side of the phase compensation LUT portion 707.

The phase value ⊖ extracted from the phase compensation LUT portion 707 and converted into the analog signal is then inputted to the phase shifter 703. As a result, the phase shifter 703 changes the phase of the amplitude compensating signal $V'_{rf}$ that has already undergone the amplitude compensation, by the phase value θ. (Specifically, the phase is turned by the given angle in an analog manner.) A signal $V''_{rf}$ as a result of the change provides a distortion compensating data.

With the above arrangement, an amplifier 704 is supplied with the distortion compensating data ($V''_{rf}$) having the amplitude and the phase already compensated. Therefore, non-linearity of the amplifier is cancelled, and the output $v_{out}$ from the amplifier maintains its linearity.

Next, the function f utilized in the distortion compensation according to the present embodiment will be described. Here, identification is made in advance to parameters a, b that will give the amplifier an output voltage a·tan h(b·$v_{in}$) of an amplifier, where $v_i$ represents a voltage amplitude input to the amplifier. With the above, the function f is a function that will give an output of:

$$f(x) = -\frac{1}{2 \cdot b} \cdot \log \frac{a - g \cdot x}{a + g \cdot x} \quad \text{[Expression 13]}$$

where $v_i$ represents an input voltage amplitude to the compensating portion (the above described amplitude compensating value calculating portion 706 and so on) and g represents a linear gain of the amplifier as after the distortion compensation. Under the conditions above, the output f(v) from the compensating portion can be regarded as an input to the amplifier (the above described $v_i$), and will give a relationship given by the expression a·tan h (b·f(v))=g·v As has been described so far, according to the present embodiment, a voltage input-output characteristic of an amplitude is first fitted to a mathematical expression represented by a hyperbolic function including predetermined parameters. Then, an envelope voltage of an input signal is applied to a function constituted by these parameters for calculation of a compensating voltage amplitude. Thereafter, the input signal is converted into an amplitude compensating signal voltage by using a compensating data, and this amplitude compensating signal voltage is inputted to the amplifier. With this arrangement, a linearity of the amplifier can be maintained, and as a result it becomes possible to achieve a highly accurate amplitude distortion compensation by a simple circuit constitution without using a quadrature demodulator.

Further, phase values uniquely corresponding to each of the envelope voltage values of the input signal is stored in a table in advance, from which a phase value uniquely corresponding to an envelope voltage value obtained by wave detection is extracted. Then, the phase of the signal voltage as after the amplitude compensation is shifted by the extracted phase value, and this shifted signal is inputted to the amplifier. Thus, not only the amplitude compensation but also the phase compensation is included in the cancellation of non-linearity of the amplifier.

[Embodiment 3]

Figure 8:
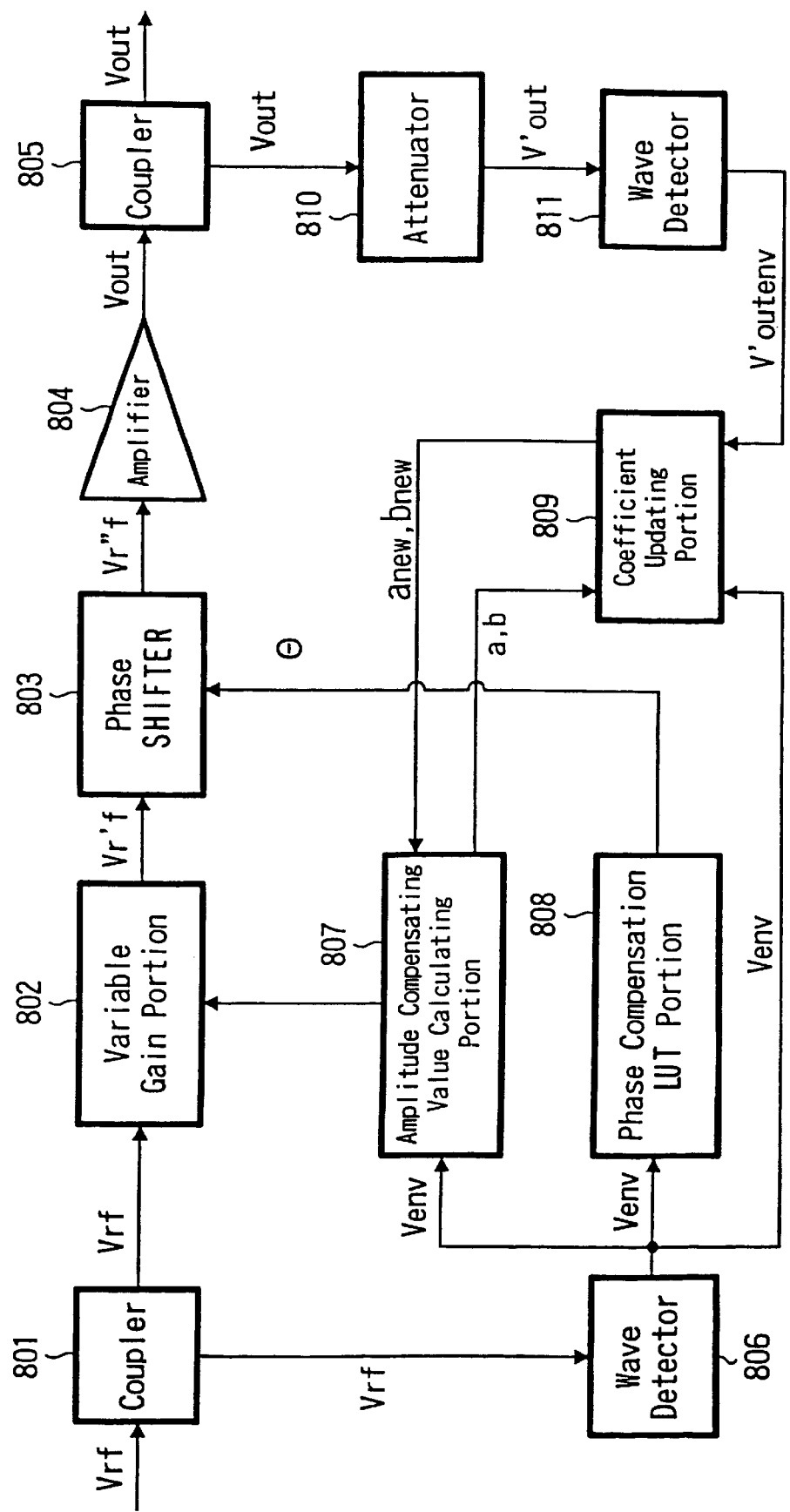
FIG. 8 is a block diagram showing a constitution of a distortion compensating device according to Embodiment 2 of the present invention.

Hereinafter, a second embodiment of the present invention will be described. FIG. 8 is a block diagram showing a constitution of a distortion compensating device according to the present Embodiment. Here again, the mobile telecommunication terminal taken as an example in Embodiment 2 can incorporate the present distortion compensating device.

A high frequency signal $V_{rf}$ outputted from a quadrature modulator of the mobile telecommunication terminal incorporating the present distortion compensating device is inputted to a variable gain portion 802 and to a wave detector 806 by a coupler 801, as shown in FIG. 8. The wave detector 806 outputs an envelope power level of the inputted high frequency signal $V_{rf}$ as an envelope voltage $V_{env}$, which is inputted to an amplitude compensation value calculating portion 807, a phase compensation LUT portion 808 and to a coefficient updating portion 809.

The phase compensation LUT portion 807 calculates a level of the compensation by applying the envelope signal $V_{env}$ to a compensating function f to be described later, and then inputs a result of the calculation to the variable gain portion 802, as conversion information. The variable gain portion 802 converts the input signal $V_{rf}$ to an amplitude compensating signal $V'_{rf}$ based on the inputted conversion information.

A phase compensation LUT portion 808 is specifically a table provided by a ROM as a nonvolatile memory, and stores data uniquely corresponding to each of the values to be taken by the envelope voltage $V_{env}$. From this table, a phase value $\ominus$ corresponding to a given value of the inputted envelope voltage $V_{env}$ is extracted, which is then outputted to a phase shifter 803. As a result, the phase shifter 803 changes the phase of the amplitude compensating signal $V'_{rf}$ from the variable gain portion 802 by the phase value $\ominus$. A signal $V''_{rf}$ as a result of the change is inputted to the amplifier as a distortion compensating data.

A coupler 805, connected on the output side of the amplifier 804, distributes the amplifier output $v_{out}$ in two directions. Specifically, the signal $v_{out}$ is inputted to a final transmitting stage (not illustrated) of the mobile telecommunication terminal, and to an attenuator 810. In the attenuator 810, the signal is attenuated to a level same as the input signal, and then inputted as a signal $V'_{out}$ to a wave detector 811. The wave detector 811 converts the attenuated signal $V'_{out}$ into an envelope voltage $V'_{outenv}$.

The envelope voltage $V'_{outenv}$ and the envelope voltage $V_{env}$ already described above are both inputted to the coefficient updating portion 809. Here, parameters a and b same as those in Embodiment 2 are calculated by using a LMS (Least Mean Square) method, so as to reduce residual distortion. As shown in FIG. 8 obtained values $a_{new}$ and $b_{new}$ are sent to the phase compensation LUT portion 807, in which the parameters a and b are updated Next, distortion compensating operation/principle according to the second embodiment will be described. First, the amplitude compensation will be described. FIG. 3 shows an input-output characteristic curve (amplitude characteristic and phase characteristic) of a typical power amplifier. The characteristic shown in a solid line is a characteristic of the amplifier before the distortion compensation. In the amplitude characteristic, when an input voltage to the amplifier is A in FIG. 3, then a corresponding output voltage is B.

However, if the amplitude characteristic of the amplifier is linear (the characteristic shown in a broken line in the diagram), then the output voltage will be B'. Thus, if A' is used as the input in place of A, then the resulting output voltage will be B', i.e. linear characteristic will be achieved in the output, without distortion. According to the present embodiment, the change from A to A' is made by using a function f to be described later.

Next, description will cover the table used in the phase compensation LUT portion 808 serving as phase compensating means. The table stores phase values uniquely corresponding to each of the values to be taken by the voltage amplitude value (envelope voltage). Referring to FIG. 3, a solid line is a phase characteristic of the amplifier before the distortion compensation. As shown in the diagram, when the input voltage is A, then a phase (transit phase) of a resulting output is D. However, if the phase characteristic of the amplifier is linear, then the output phase will be D".

Thus, according to the present embodiment, phase of the input to the amplifier is displaced in advance to D' on a curve drawn in a dashed line, so that the output phase as after the amplifier becomes D", thereby eliminating the phase distortion in the output. For this purpose, according to this embodiment, out of the characteristic curves shown in FIG. 3, all of the phase values D' on the dashed line are stored in the table correspondingly to the input value A, over the entire input range. Thus, the table storing the compensating phase values uniquely corresponding to each of the voltage amplitude values is provided.

Hereinafter, the function f utilized in the present embodiment will be described in detail. First, the voltage input-output characteristic of the amplifier is fitted in advance to a hyperbolic tangent function $v_{out} = a \cdot \tanh(b \cdot v_{in})$ by using the above mentioned parameters a, b, where $v_{in}$ and $v_{out}$ represent an input voltage and an output voltage of the amplifier respectively, and g represents a linear gain.

Figure 9:
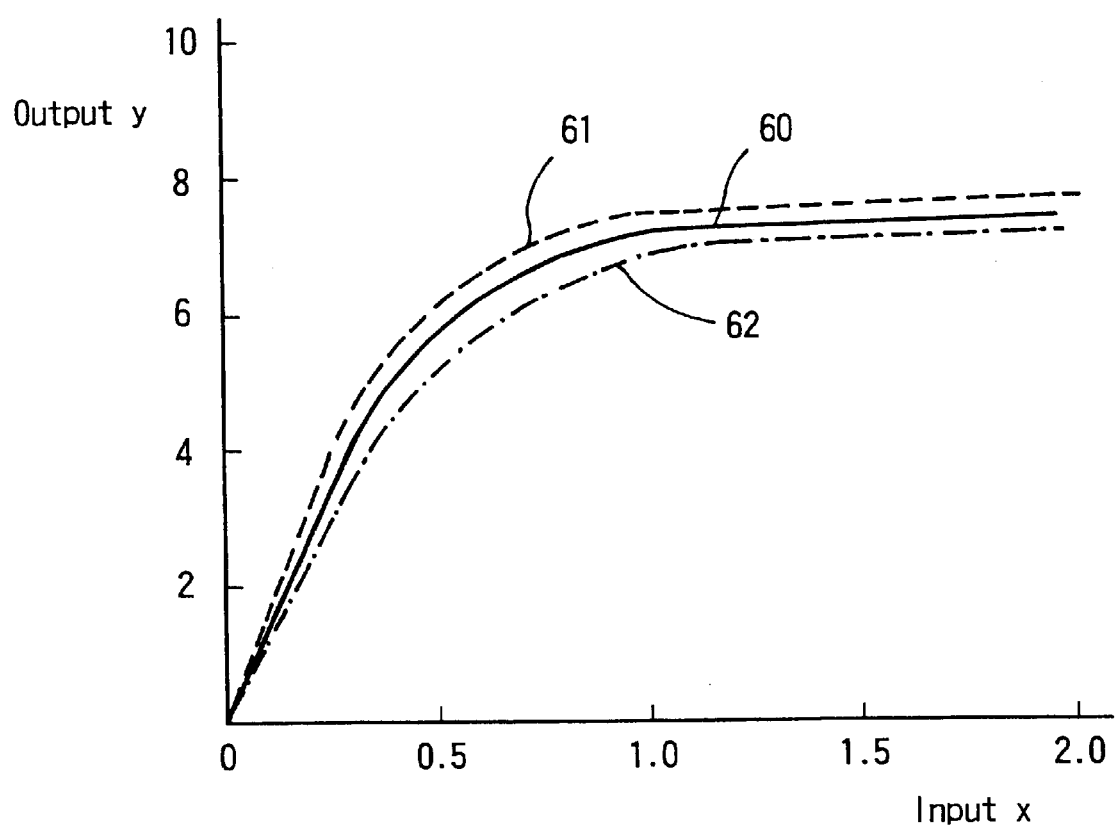
FIG. 9 is a diagram showing a characteristic of a hyperbolic tangent function responding to parameter variation.

Next, adaptive compensation by using the parameters a and b of the function f(x). It is known that the gain, e.g. level of saturated region, of the power amplifier can be changed by temperature for example. FIG. 9 shows characteristic curves of the hyperbolic tangent function corresponding to parameter variation. Specifically, the curves show characteristics when the parameters a and b are varied in $y = a \cdot \tanh(b \cdot x)$ In FIG. 9, a curve 60 is a characteristic graph, where a=7.5 and b=2.0. Curves 61, 62 are characteristics when a is varied by ±0.3 and b is varied by ±0.1. Specifically, The curve 61 is the characteristic curve where a=7.8 and b=2.1, whereas the curve 62 is the characteristic curve where a=7.2 and b=1.9. These curves have a favorable match with actual gain variation characteristic of the amplifier.

Therefore, according to the third embodiment, the characteristic of the hyperbolic tangent function is used for the adaptive compensation. specifically, optimum parameter values a and b are calculated by using the LMS method. As has been described above, the coefficient updating portion 809 in FIG. 8 is supplied with the input signal envelope voltage $V_{env}$, the output signal envelope voltage $V_{outenv}$, and the parameters a and b used in the compensation LUT portion 207. Here, with E representing an error, the following expression is considered.

$$E = |V'_{outenv} - a \cdot \tanh(b \cdot V_{env})|^2 \qquad \text{[Expression 15]}$$

If the distortion compensation operates effectively, leaving no residual distortion in the output signal, then the error E will be equal to zero. However, if temperature change and so on makes the parameters a and b not appropriate for the distortion compensation, then a distortion will remain in the output signal from the amplifier, and the error E will no longer be zero. Thus, the present embodiment uses an LMS method for real-time updating of the optimum parameters a and b based on the error E.

In the LMS method, the following expressions are used for the real-time updating of the parameters a and b that determines the error E.

$$\frac{da}{dt} = -\frac{\partial E}{\partial a} \qquad \text{[Expression 16]}$$

According to the present embodiment, the error E has a relationship represented by the [Expression 15] shown above. Therefore, the following relationship can be drawn.

$$\frac{\partial E}{\partial a} = 2 \cdot V'_{outenv} \cdot \tanh(b \cdot V_{env}) - 2 \cdot a \cdot \tanh^2(b \cdot V_{env}) \qquad \text{[Expression 17]}$$

$$\frac{\partial E}{\partial b} = 2 \cdot a \cdot V_{env} \cdot \text{sech}(b) \cdot \{a \cdot \tanh \cdot (b \cdot V_{env}) - V'_{outenv}\}$$

Here, if the above expressions are made discrete by using a small constant $\alpha$, then parameter updating expressions are obtained as follows.

$$a_{new} = a - \alpha \cdot [2 \cdot V'_{outenv} \cdot \tanh(b \cdot V_{env}) - \qquad \text{[Expression 18]}$$

$$2 \cdot a \cdot \tanh^2(b \cdot V_{env})]$$

$$b_{new} = b - \alpha \cdot [2 \cdot a \cdot V_{env} \cdot \text{sech}(b) \cdot -$$

$$(a \cdot \tanh \cdot (b - V_{env}) - V'_{outenv}]$$

According to the distortion compensation provided by the present embodiment, the updated parameters $a_{new}$ and $b_{new}$ thus obtained are sent from the coefficient updating portion 809 to the phase compensation LUT portion 807 as shown in FIG. 8, thereby updating the parameters a and b necessary for the next calculation of the amplitude compensating value.

Figure 10:
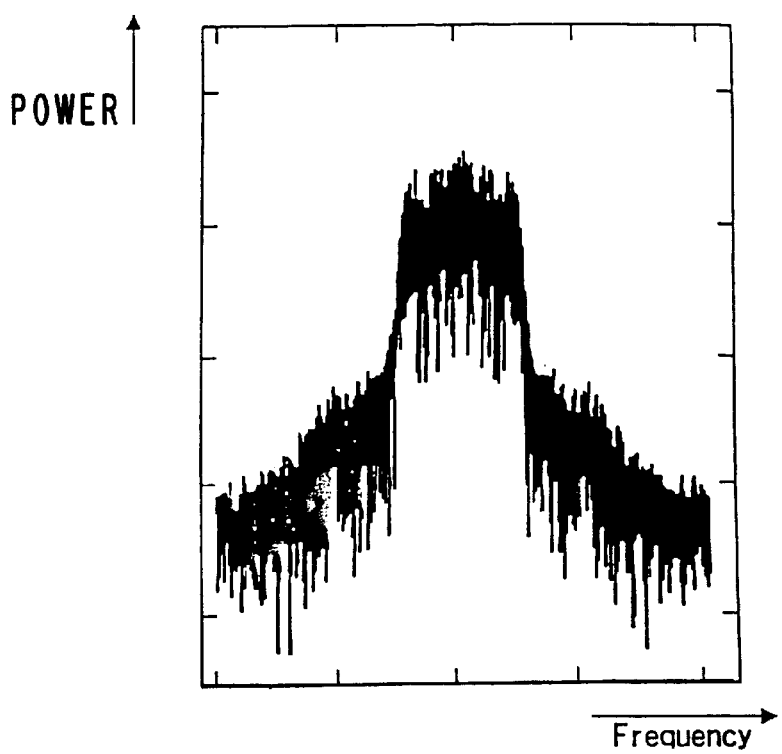
FIG. 10 is a spectrum of an output obtained by inputting a signal to a power amplifier that has amplitude distortion.

Now, effect of the distortion compensation according to the present embodiment to a power amplifier will be demonstrated on the basis of output waveform from the power amplifier. FIG. 10 shows an output spectrum (not a measurement from actual operation but from a simulation) obtained by inputting an OQPSK signal (signal according to an actual CDMA method (cdmaOne)) to the power amplifier having an amplitude-phase distortion, i.e. a power amplifier not provided with distortion compensation. The vertical axis of the diagram represents signal power, whereas the horizontal axis represents frequency. The width of the square portion is 1.25 MHz. Adjacent channel leak power ratio (ACPR) indicated as a level difference between the wave peak portion (center frequency) and the shoulder portions is −32 dBc.

Figure 11:
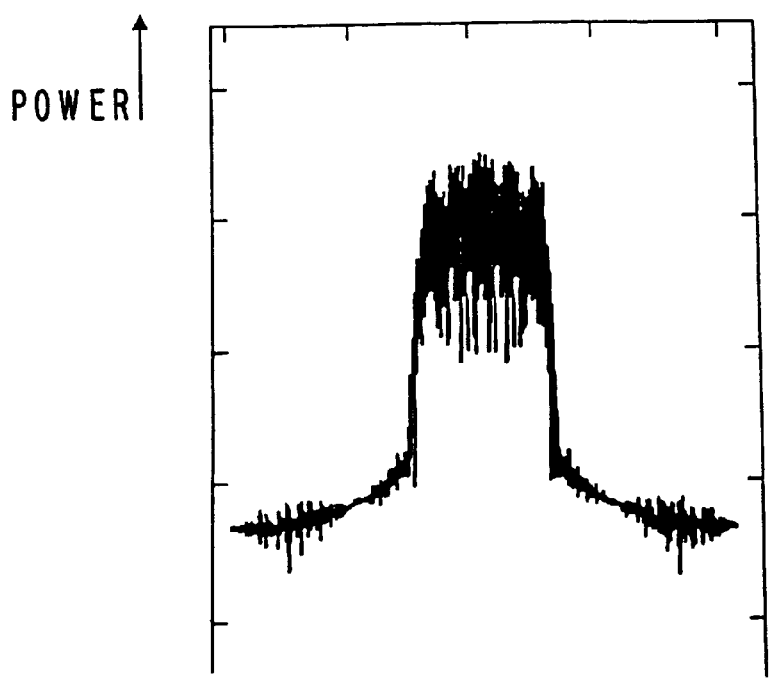
FIG. 11 is an output spectrum of the power amplifier provided with a distortion compensation.

FIG. 11 shows an output spectrum (again, not from an actual operation but from a simulation) obtained by inputting the same OQPSK signal as used in FIG. 10 to the power amplifier provided with the distortion compensation according to the present invention. The ACPR in this diagram is −55 dBc, and there is an improvement of −32−(−55)=23 dB over the case in FIG. 10.

As has been described, according to Embodiment 3, first, a voltage input-output characteristic of an amplifier is identified in advance by using a predetermined hyperbolic tangent function. Variation in parameters a and b included in the function represents a gain variation characteristic of the amplifier, and characteristic of the hyperbolic tangent function is utilized in the adaptive compensation. With this arrangement, even if temperature change for example causes the amplifier characteristic to change thereby increase distortion, these parameters a and b are updated to values that cancel the distortion. Therefore, the present invention provides an effect that distortion of the amplifier can always be compensated by using the newest parameters that match the state of the amplifier.

Further, according to the present embodiment again, phase values uniquely corresponding to each of the values to be taken by the envelope voltage are stored in advance in a table, from which a phase value corresponding to an envelope voltage obtained by wave detection is extracted. With this arrangement, a phase of the signal voltage as after the amplitude compensation is changed by the extracted phase value. Thus, non-linearity of the amplifier can be easily cancelled It should be noted that the present invention is not limited to the embodiments described above, but may be varied in many ways within the spirit of the present invention. For example, in each of the embodiment described above, calculation of the amplitude compensating value and extraction of the phase value from the table may be performed by using a digital signal processor or a microprocessor in accordance with a preloaded program sequence.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A distortion compensating device for compensating an input-output characteristic of an amplitude and a phase of amplifying means, comprising:

a distortion compensating device provided with amplitude compensating means for conversion of an inphase signal I and an orthogonal signal Q into an in-phase signal I'=f($v_i$) and an orthogonal signal Q'=f($v_q$) for compensating a voltage amplitude, where $v_i$ represents a voltage of the in-phase signal and $v_q$ represents a voltage of the orthogonal signal; and means for performing the conversion by applying $v_i$ and vq to a function constituted by using two coefficients a and b and given as f(v)=−½·b·log((a−g·v)/(a+g·v)), the coefficients a and b being obtained as two parameters that fit the input-output characteristic of the amplifying means to a hyperbolic tangent function $v_{out}$=a·tan h (b·$v_{in}$), where $v_{in}$ and $v_{out}$ represent an input voltage and output voltage respectively of the amplifying means, and g represents a linear gain.

2. A distortion compensating device comprising:

amplitude compensating means for conversion of an in-phase signal I and an orthogonal signal Q into an in-phase signal I'=f(vi) and an orthogonal signal Q'=f ($v_q$) for compensating a voltage amplitude, where $v_i$ represents a voltage of the in-phase signal and $v_q$ represents a voltage of the orthogonal signal, the conversion being performed by applying $v_i$ and $v_q$ to a function constituted by using two coefficients a and b and given as f(v)=−½·b·log((a−g·v)/(a+g·v)), the coefficients a and b being obtained as two parameters that fit the input-output characteristic of the amplifying means to a hyperbolic tangent function $v_{out}$=a·tan h (b·$v_{in}$), where $v_{in}$ and $v_{out}$ represent an input voltage and output voltage respectively of the amplifying means, and g represents a linear gain;

voltage amplitude computing means for computing a voltage amplitude v=(I'$^2$+Q'$^2$) of the two signals I' and Q';

a phase reference table storing a table of data uniquely corresponding to each value of the voltage amplitude v for extraction, from the table, of a specific phase value uniquely corresponding to a given voltage amplitude v; and phase synthesizing means for computing I"=I' cos−Q'·sin and Q"=Q'·cos+I'·sin, by using the phase value and the two signals I' and Q', characterized in that the two signals I" and Q" are used as distortion compensating data.

3. The distortion compensating device according to claim 1 or claim 2, further comprising:

means for storing a plurality of phase values corresponding to a plurality of envelope voltages;

means for extracting from the plurality of phase values a phase value θ corresponding to an envelope voltage of a modulated input signal; and means for changing a phase of the modulated input signal by the amount of the extracted phase value θ.

4. A distortion compensating device comprising:

voltage amplitude computing means for computing a voltage amplitude v=√(I$^2$+Q$^2$) of two signals provided by an in-phase signal I and an orthogonal signal Q;

phase difference computing means for calculating a phase difference φ between the two signals I and Q;

amplitude compensating means for applying the voltage amplitude v provided by an output from the voltage amplitude computing means to a function f thereby converting into a compensating voltage amplitude f(v);

I-Q restoring calculating means for calculating a signal I'=f(v)·cos φ and Q'=f(v)·sin φ, from the phase difference φ and the compensating voltage amplitude f(v);

a phase reference table storing a table of phase values uniquely corresponding to each value of the voltage amplitude for extraction, from the table, of a phase value θ uniquely corresponding to a given compensating voltage amplitude f(v); and phase synthesizing means for computing I"=I' cos θ−Q'·sin θ and Q"=Q'·cos θ+I'·sin θ, by using the phase value θ and the two signals I' and Q', characterized in that the two signals I" and Q" are used as distortion compensating data.

5. The distortion compensating device according to claims 1, 2, or 4, wherein the calculation of the amplitude compensating value and/or the extraction of the phase value are performed by using a digital signal processor.

6. The distortion compensating device according to claims 1, 2, or 4, wherein the calculation of the amplitude compensating value and/or the extraction of the phase value are performed by using a logic circuit.

7. A distortion compensating device connected before an input to a power amplifier, the device comprising:

means for detecting a modulated signal thereby obtaining an envelope voltage $V_{env}$ of a detected envelope signal;

means for fitting voltage input-output characteristics of the power amplifier to a hyperbolic function including parameters a and b, given as $V_{out}$=a·tan h (b·$v_i$) , where $v_i$ represents an input voltage and $V_{out}$ represents an output voltage;

means for calculating an amplitude compensating value $f(V_{env})$ by substituting the envelope voltage $V_{env}$ for x in a function including the parameters a and b, given as:

$$f(x) = -\frac{1}{2 \cdot b} \cdot \log\frac{a - g \cdot x}{a + g \cdot x}$$

where g represents a linear gain of the power amplifier;

means for converting an amplitude of the modulated signal based on the calculated amplitude compensating value; and means for inputting the modulated signal after the conversion to the power amplifier.

8. The distortion compensating device according to claim 7, wherein the calculation of the amplitude compensating value and updated parameters and/or the extraction of the phase value are performed by using a digital signal processor.

9. The distortion compensating device according to claim 7, wherein the calculation of the amplitude compensating value and updated parameters and/or the extraction of the phase value are performed by using a logic circuit.

10. The distortion compensating device according to claim 4 or claim 7, further comprising:

means for storing a plurality of phase values corresponding to a plurality of envelope voltages;

means for extracting from the plurality of phase values a phase value ⊖ corresponding to an envelope voltage of an input signal; and means for changing a phase of a modulated signal by the amount of the extracted phase value ⊖.

11. A distortion compensating device connected before an input to a power amplifier, comprising:

means for detecting a modulated signal thereby obtaining a first envelope voltage of a detected envelope signal;

means for fitting a voltage input-output characteristics of the power amplifier to a first function that uses predetermined parameters;

means for calculating an amplitude compensating value by applying the first envelope voltage to a second function constituted by the parameters after the fitting and a linear gain of the power amplifier;

means for converting an amplitude of the modulated signal based on the amplitude compensating value;

means for detecting an output from the power amplifier corresponding to an input of the modulated signal after the conversion, thereby obtaining a second envelope voltage of a detected envelope signal; and means for applying the first envelope voltage and the second envelope voltage to a third function including the parameter used for the calculation of the amplitude compensating value, thereby updating the predetermined parameters, characterized in that the predetermined parameters after the updating are applied to the means for fitting.

12. A distortion compensating device connected before an input to a power amplifier, comprising:

means for detecting a modulated signal, thereby obtaining a first envelope voltage $V_{env}$ of a detected envelope signal;

means for fitting voltage input-output characteristics of the power amplifier to a hyperbolic function including parameters a and b given as $v_{out}$=a·tan h (b·$v_i$) , (where $v_i$ represents an input voltage and $v_{out}$ represents an output voltage);

means for calculating an amplitude compensating value $f(V_{env})$ by substituting the first envelope voltage $V_{env}$ for x in a function including the parameters a and b, given as:

$$f(x) = -\frac{1}{2 \cdot b} \cdot \log\frac{a - g \cdot x}{a + g \cdot x}$$

where g represents a linear gain of the power amplifier;

means for converting an amplitude of the modulated signal based on the calculated amplitude compensating value;

means for detecting an output from the power amplifier corresponding to an input of the modulated signal after the conversion, thereby obtaining a second envelope voltage $V'_{outenv}$ of a detected envelope signal; and means for calculating updated parameters $a_{new}$ and $b_{new}$ of the parameters a and b, from a third function constituted by the parameters a and b used for the calculation of the amplitude compensating value and the envelope voltages $V_{env}$ and $V'_{outenv}$, given as:

$$a_{new} = a - \alpha \cdot [2 \cdot V'_{outenv} \cdot \tanh(b \cdot V_{env}) - 2 \cdot a \cdot \tanh^2(b \cdot V_{env})]$$

$$b_{new} = b - \alpha \cdot [2 \cdot a \cdot V_{env} \cdot \text{sech}(b) \cdot - (a \cdot \tanh \cdot (b - V_{env}) - V'_{outenv}]$$

where α represents a constant, characterized in that the updated parameters $a_{new}$ and $b_{new}$ are applied to the means for fitting.

13. A distortion compensating method for performing a distortion compensation on a signal before being fed to a power amplifier, comprising:

a step of detecting a modulated signal, thereby obtaining an envelope voltage of a detected envelope signal;

a step of fitting voltage input-output characteristics of the power amplifier to a first function including a predetermined parameter, a step of calculating an amplitude compensating value by applying the envelope voltage to a second function constituted by the parameter after the step of fitting and a linear gain of the power amplifier, a step of converting an amplitude of the modulated signal based on the amplitude compensating value, and a step of inputting the modulated signal after the step of converting to the power amplifier.

14. A distortion compensating method for performing a distortion compensation on a signal before being fed to a power amplifier, comprising:

a step of detecting a modulated signal thereby obtaining an envelope voltage $V_{env}$ of a detected envelope signal;

a step of fitting voltage input-output characteristics of the power amplifier to a hyperbolic function including parameters a and b, given as $v_{out}=a \cdot \tan h\ (b \cdot v_i)$, where $v_i$ represents an input voltage and $v_{out}$ represents an output voltage;

a step of calculating an amplitude compensating value $f(V_{env})$ by substituting the envelope voltage $V_{env}$ for x in a function including the parameters a and b, given as:

$$f(x) = -\frac{1}{2 \cdot b} \cdot \log\frac{a - g \cdot x}{a + g \cdot x}$$

where g represents a linear gain of the power amplifier;

a step of converting an amplitude of the modulated signal based on the amplitude compensating value; and a step of for inputting the modulated signal after the step of converting to the power amplifier.

* * * * *